United States Patent [19]
Matloubian

[11] Patent Number: 5,144,390
[45] Date of Patent: Sep. 1, 1992

[54] SILICON-ON INSULATOR TRANSISTOR WITH INTERNAL BODY NODE TO SOURCE NODE CONNECTION

[75] Inventor: Mishel Matloubian, Dallas, Tex.

[73] Assignee: Texas Instruments Incorporated, Dallas, Tex.

[21] Appl. No.: 663,190

[22] Filed: Feb. 28, 1991

Related U.S. Application Data

[63] Continuation of Ser. No. 471,660, Jan. 23, 1990, abandoned, which is a continuation of Ser. No. 241,167, Sep. 2, 1988, abandoned.

[51] Int. Cl.$^5$ .............................................. H01L 27/01
[52] U.S. Cl. ................................ 357/23.7; 357/23.4; 357/23.3
[58] Field of Search ................ 357/23.7, 23.4, 23.3, 357/12, 67 S

[56] References Cited

U.S. PATENT DOCUMENTS

| | | | |
|---|---|---|---|
| 4,053,916 | 11/1977 | Cricchi et al. | 357/23.7 |
| 4,797,721 | 1/1989 | Hsu | 357/23.7 |
| 4,969,023 | 11/1990 | Svedberg | 357/23.7 |

FOREIGN PATENT DOCUMENTS

| | | | |
|---|---|---|---|
| 0018052 | 5/1980 | Japan | 357/23.7 |
| 55-71068 | 5/1980 | Japan | 357/23.7 |
| 56-91473 | 7/1981 | Japan | 357/23.7 |
| 0088474 | 5/1985 | Japan | 357/67 S |

OTHER PUBLICATIONS

Fogiel, *Modern Microelectronics* (Research and Education Association, N.Y., 1972), pp. 292, 534–536.
Tihanyi et al., "Properties of ESFI MOS Transistors Due to the Floating Substrate and the Finite Volume", *IEEE Transactions on Electron Devices*, vol. ED-22, No. 11, Nov. 1975, 1017–1023.
Tihanyi et al., "Influence of the Floating Substrate Potential on the Characteristics of ESFI MOS Transistors", *Solid State Electronics*, (Pergamon) 1975, vol. 18, pp. 309–314.
Lee et al., "Island-Edge Effects in C-MOS/SOS Transistors", *IEEE Transactions on Electron Devices*, vol. ED-25, No. 8, Aug., 1978, pp. 971–978.
Kumamoto et al., "An SOI Structures for Flash A/D Converter" *IEEE Journal of the Solid-State Circuits*, vol. 23, No. 1, Feb. 1988; pp. 198–201.

*Primary Examiner*—Jerome Jackson, Jr.
*Assistant Examiner*—Hung Xuan Dang
*Attorney, Agent, or Firm*—Richard A. Stoltz; Richard L. Donaldson; Jay Cantor

[57] ABSTRACT

A transistor and a method of making a transistor are disclosed, where a tunnel diode is formed to make connection between the source of the transistor and the body node underlying the gate. For the example of an n-channel transistor, a p+ region is formed by implant and diffusion under the n+ source region, the p+ region in contact on one end with the relatively lightly doped p-type body node. The relatively high dopant concentration of both the p+ region and the n+ source region creates a tunnel diode. The tunnel diode conducts with very low forward voltages, which causes the body node region to be substantially biased to the potential of the source region. Methods for forming the transistor are also disclosed, including the use of a source/drain anneal prior to p-type implant, or alternatively a second sidewall oxide filament, to preclude the boron from counterdoping the LDD extension at the source side. Both silicon-on-insulator and bulk embodiments are disclosed.

13 Claims, 4 Drawing Sheets

SILICON-ON INSULATOR TRANSISTOR WITH INTERNAL BODY NODE TO SOURCE NODE CONNECTION

This invention was made with government support under Contract No. SO 1509 S-408 awarded by the Air Force. The government has certain rights in this invention.

This application is a continuation of application Ser. No. 471,660, filed Jan. 23, 1990 now abandoned, which is a continuation of application Ser. No. 07/241,167, filed Sep. 2, 1988, now abandoned.

This invention is in the field of integrated circuits, and is specifically directed to insulated-gate field effect transistors formed by silicon-on-insulator (SOI) technology.

BACKGROUND OF THE INVENTION

Silicon-on-insulator (SOI) technology is becoming of increasing importance in the field of integrated circuits. SOI technology deals with the formation of transistors in a layer of semiconductor material which overlies an insulating layer; the most common embodiment of SOI structures is a single crystal layer of silicon which overlies a layer of silicon dioxide. High performance and high density integrated circuits are achievable using SOI technology because of the reduction of parasitic elements present in integrated circuits formed in bulk semiconductor. For example, for an MOS transistor formed in bulk, parasitic capacitance is present at the junction between the source/drain regions and the underlying substrate, and the possibility of breakdown of the junction between source/drain regions and the substrate region also exists. A further example of parasitic elements are present for CMOS technology in bulk, where parasitic bipolar transistors formed by n-channel and p-channel transistors in adjacent wells can give rise to latch-up problems. Since SOI structures significantly alleviate the parasitic elements, and increase the junction breakdown tolerance of the structure, the SOI technology is well-suited for high performance and high density integrated circuits.

It should be noted that a similar technology to SOI is the silicon-on-sapphire (SOS) technology, which provides similar benefits as those discussed relative to SOI technology above. It should be noted that the invention to be disclosed herein is applicable to SOS structures, as well.

The underlying insulator film in an SOI structure presents certain problems relative to the transistor characteristics, however. In bulk transistors, electrical connection is easily made via the substrate to the body node of an MOS transistor. The relatively fixed bias of the body node provides for a stable threshold voltage relative to the drain-to-source voltage. However, conventional SOI transistors have the body node (i.e., the undepleted volume within the body region) electrically floating, as the body node is isolated from the substrate by the underlying insulator film. Under sufficient drain-to-source bias (even, in some cases, with zero gate bias), impact ionization can generate electron-hole pairs near the drain which, due to the majority carriers traveling to the body node while the minority carriers travel to the drain, cause a voltage differential between the body node and the source of the transistor. This voltage differential lowers the effective threshold voltage and increases the drain current, resulting in the well known "kink" in the drain current-voltage characteristic.

Furthermore, the SOI transistor includes a parasitic "back channel" transistor, with the substrate as the gate and the insulator film underlying the transistor as the gate dielectric. This back channel may provide a drain-source leakage path along the body near the interface with the buried insulator. In addition, the dielectrically isolated body node allows capacitive coupling between the body node and the gate, and diode coupling between the body node and the source and drain, to bias the body node and thus affect the threshold voltage. Each of these factors can contribute to undesirable performance shifts in the transistor relative to design, as well as to increased instability of the transistor operating characteristics.

It is therefore useful to provide electrical bias to the body node of a transistor. A useful body node bias, as in the bulk case, is to ohmically connect the body node to the source of the MOS transistor. This requires that the source node of the transistor be specified, and connection made thereto from the body node of the transistor. Prior methods for body-to-source node connection require specification of the mesa regions on the sides of the gate as drain and source relatively early in the fabrication process. An example of such a method is described in copending application Ser. No. 150,799 filed Feb. 1, 1988 and assigned to Texas Instruments Incorporated, where the source is defined by dedicating a portion of the mesa adjacent to the gate to receive an implant of the same conductivity type as the body, and connecting this dedicated portion to the source via a refractory metal silicide.

It is preferable, of course, that such connection to the body node of an SOI transistor occupy as little surface area as possible. It is especially preferable that such connection not occupy a portion of the source region which is adjacent to the gate, so that the effective channel width of the transistor is not reduced in order to provide such connection.

It is therefore an object of this invention to provide an insulated-gate field effect transistor formed in a semiconductor region overlying an insulator, having a buried source-to-body node connection, so that surface area of the transistor is not required for such connection.

It is another object of this invention to provide such a transistor which provides such connection along the full length of the body node to reduce the distance of travel for impact ionization current, thereby minimizing localized potential drift of the body node.

It is another object of this invention to provide such a transistor having such connection without reduction in the effective channel width of the transistor.

It has further been discovered that the back-channel leakage transistor described hereinabove can be reduced by the provision of a heavily doped region of opposite conductivity type from the drain at the interface of the silicon and the underlying insulator. Such a region will not impact the true MOS current desired at the upper surface (i.e., controlled by the gate), but will provide a reverse-biased junction at back-channel, reducing drain-to-source leakage thereat. The provision of such a region accordingly increases the tolerance of the transistor to ionizing radiation, since such ionizing radiation can lower the threshold of the back-channel device via charge trapping at the lower interface.

It has further been discovered that, in many SOI technologies, the silicon film overlying the insulating layer is prone to have a number of dislocation and twinning defects, such defects being more highly concentrated near the interface with the underlying insulating layer. During the drive-in of the dopant forming the source and drain regions in a typical SOI transistor, the source and drain dopant can diffuse more rapidly in the portion of the silicon film having such defects. Such enhanced diffusion can create drain-to-source leakage, and in the extreme case of such diffusion, the source and drain may be connected together. Provision of a heavily doped region of opposite conductivity type below the source and near the insulating layer interface can reduce the leakage from such enhanced diffusion both by removing the diffusion dopant from the source (i.e., the dopant can diffuse only from the drain side), as well as providing a reverse-biased junction between drain and source in the event enhanced diffusion from the drain reaches all the way under the gate.

It is therefore an object of this invention to provide a transistor having body-to-source node connection formed by a buried region, so that a reverse-biased junction is provided between the drain and the connection at the interface of the semiconductor to the underlying insulator film.

It is therefore a further object of this invention to provide such a connection which reduces drain-to-source leakage due to enhanced diffusion effects in an SOI transistor.

Other objects and advantages of the invention will become apparent to those of ordinary skill in the art having reference to this specification and the accompanying drawings.

SUMMARY OF THE INVENTION

The invention may be incorporated into a silicon-on-insulator insulated-gate field effect transistor which has a heavily doped buried region of the same conductivity type as the body node disposed under the source diffusion of the transistor. The junction between the heavily doped buried region and the heavily-doped source region forms a leaky diode, so that the body node is biased to the potential of the source region without requiring a topside contact. The buried source region may be formed by ion implantation of the source/drain of the opposite conductivity type (such as is available in a CMOS configuration), or separate implantation for the buried region may be done either before or after the formation of the gate electrode.

DETAILED DESCRIPTION OF THE PREFERRED EMBODIMENT

Figure 1:
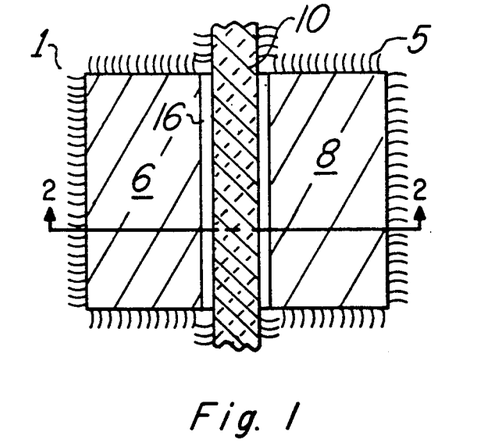
FIG. 1 is a plan view of a SOI transistor.
Figure 2:
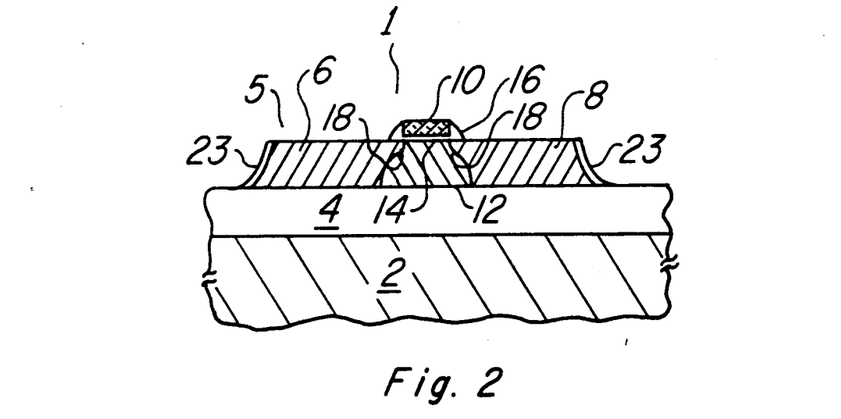
FIG. 2 is a cross-sectional view of the transistor of FIG. 1, constructed according to the prior art.

Referring to FIGS. 1 and 2, an n-channel SOI transistor according to the prior art is illustrated in plan view and cross-sectional view, respectively. As shown in FIG. 2, the transistor is formed in a single-crystal silicon mesa 5 overlying an insulator film 4 which is formed on a silicon substrate 2. Insulator film 4 is generally silicon dioxide. The formation of mesa 5 over insulator 4 can be done by any one of a number of known methods such as SIMOX (Separation by IMplanted Oxygen), oxidized porous silicon (FIPOS), and thin film zone-melting recrystallization (ZMR). An example of the SIMOX process is described in application Ser. No. 035,126 filed Apr. 7, 1987, and assigned to Texas Instruments Incorporated.

Gate insulator 14, such as thermally grown silicon dioxide, deposited silicon nitride, or a combination thereof, is disposed on the surface of single-crystal mesa 5. Gate electrode 10, commonly formed of heavily doped polycrystalline silicon, overlies gate insulator 14, and defines the gate of the MOS transistor of FIGS. 1 and 2. Source region 6 and drain region 8 are heavily-doped n-type regions which are formed by ion implantation and subsequent diffusion. As shown in FIG. 2, this example of a conventional transistor is formed according to the well-known lightly-doped drain (LDD) construction, with implantation of LDD regions 18 performed in a self-aligned manner to gate electrode 10 (generally prior to formation of sidewall oxide filaments 16). An example of a method for forming lightly-doped drain transistors by use of sidewall oxide filaments is described in U.S. Pat. No. 4,356,623 issued Nov. 2, 1982 and assigned to Texas Instruments Incorporated. The heavily doped portions of source and drain regions 6 and 8 of FIGS. 1 and 2 are shown as formed in self-aligned fashion relative to the gate electrode 10 and sidewall oxide filaments 16, and fully extend from the surface of mesa 5 to the interface with insulator 4. Body node region 12 in this embodiment is a p-type region which is lightly doped relative to the impurity concentration of n-type source and drain regions 6 and 8; as is well known in the art, a threshold voltage adjust implant may have been performed in the portion of body node region 12 under gate dielectric 14 prior to formation of gate electrode 10. Sidewall insulator filaments 23 passivate the edges of mesa 5.

It should be noted that a refractory metal silicide film (not shown in FIG. 2) such as titanium disilicide, may be used to clad source and drain regions 6 and 8, as well as gate electrode 10. Such silicidation is useful in reducing the sheet resistance of the semiconducting layers, and is preferably done according to the well-known self-aligned direct react silicidation process, such as is described in U.S. Pat. No. 4,690,730 issued Sep. 1, 1987 and assigned to Texas Instruments Incorporated. Such silicidation is of course not essential to the operation of the transistor. Any one of the well known refractory metals conventionally used in silicidation, such as molybdenum, tungsten, and cobalt, may alternatively be used for formation of this silicide film.

For transistor 1 of FIGS. 1 and 2, body node 12 is electrically isolated in the transistor of FIGS. 1 and 2. Since source and drain regions 6 and 8 extend through the full thickness of mesa 5 to reach insulator 4, and since the self-alignment of source and drain regions 6 allows body node 12 to exist only under gate electrode 10 (and lightly-doped drain regions 18, if present), it is inconvenient to form a contact to body node 12 in the structure of FIGS. 1 and 2. Accordingly, conventional SOI technology has the body node 12 of each MOS transistor in a floating state.

The floating body node of the SOI transistor 1 presents certain problems in the performance, and performance stability, of the transistor. A first problem is the presence of a parasitic "back channel" transistor, having substrate 2 as a gate electrode and insulator film 4 as the gate dielectric. This back channel may provide for a drain-source leakage path along the body node 12 near the interface with insulator film 4, depending upon the local potential of substrate 2 at the transistor location. In addition, it is well known that the voltage of body node 12 will affect the threshold voltage ($V_t$) of the transistor. While in bulk devices the MOS transistor body nodes are biased by the substrate, the dielectrically isolated body node 12 of transistor 1 of FIGS. 1 and 2 allows capacitive coupling between body node 12 and gate electrode 10, and diode coupling between body node 12 and source and drain regions 6 and 8, to bias body node 12 to an undesired potential. Furthermore, impact ionization occurs when carriers near the drain are at a sufficiently high potential that electron-hole pairs are created which, due to the majority carriers traveling to the body node while the minority carriers travel to the drain, cause a voltage differential between body node 12 and source region 6, lowering the effective threshold voltage and increasing the drain current (i.e., the well known "kink" effect).

Figure 3:
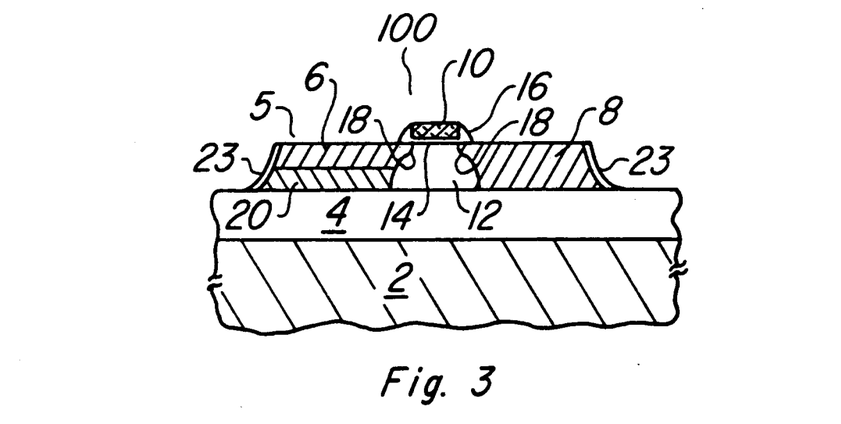
FIG. 3 is a cross-sectional view of a transistor constructed according to the invention.

Referring now to FIG. 3, a cross-sectional view of a transistor 100 constructed according to the invention is illustrated. Elements of transistor 100 which correspond to elements of transistor will be referred to by like reference numerals. The plan view of transistor 100 of FIG. 3 resembles that of transistor 1, and accordingly is not shown. Transistor 100 incorporates a heavily-doped p-type region 20 underlying source region 6, and extending so as to be in contact with body node 12 underlying gate electrode 10. The impurity concentration of p+ region 20 is preferably in the range of $10^{18}$ to $10^{21}/cm^3$, with the body node 12 having an impurity concentration of $10^{17}/cm^3$. Source and drain regions 6 and 8 generally can have an impurity concentration of $10^{19}$ to $10^{21}/cm^3$, with LDD regions 18 (if used) having an impurity concentration in the range of $10^{18}$ to $10^{20}/cm^3$, depending upon the dopant gradient desired.

Since both p+ region 20 and source region 6 are relatively heavily doped, p+ region 20 provides connection between source region 6 and body node 12 in the form of a tunnel diode. Accordingly, under low forward bias at this junction, as would be present with drain region 8 biased to a voltage positive with respect to source region 6, there will be sufficient conduction from the body node 12 through p+ region 20 to source region 6, which would thereby keep body node 12 biased to a potential relatively close to that of source region 6. This bias will prevent the problems associated with the floating body node, as described hereinabove. It should also be noted that there is no additional surface area of mesa 5 required for the provision of this connection (in fact, the plan views of transistor 1 of FIG. 2 and transistor 100 of FIG. 3 are identical) according to the invention. It should further be noted that there is no reduction in the channel width of transistor 100 required for contact between source region 6 and body node 12, since the connection is made under source region 6, at a location away from gate electrode 10.

As discussed above, back-channel drain-to-source leakage along the interface with insulator film 4 is a known problem in the SOI art. With reference to FIG. 3 again, it should be noted that p+ region 20 will substantially reduce such leakage along this interface from drain region 8 to source region 6. Even if body node 12 is inverted at this interface, it should be noted that p+ region 20 will present a reverse-biased diode to leakage from drain region 8 through the inverted portion of body node 12, significantly limiting drain-to-source leakage along the back-channel of transistor 100. As described above, exposure to ionizing radiation can lower the threshold voltage of the parasitic back-channel device, due to charge trapping at the interface between mesa 5 and insulating film 4. The provision of p+ region 20 in transistor 100, due to the reverse-biased diode presented in the event that the portion of body node 12 adjacent insulating film 4 is inverted, thus provides increased tolerance of transistor 100 to such ionizing radiation.

Furthermore, as discussed above, enhanced diffusion of dopant from drain region 8 and source region 6 can occur along the interface between mesa 5 and insulator film 4, since dislocation and twinning defects in SOI films formed according to various technologies have been observed to be more prevalent near the interface with the underlying insulator film 4. The provision of p+ region 20 reduces the effects of such enhanced diffusion, as n-type dopant can diffuse only from drain region 8 along this interface, rather than from both drain region 8 and source region 6 as in transistor 1 of FIG. 2. Accordingly, such enhanced diffusion must occur to a greater degree in transistor 100 in order to reach across body node 12. Furthermore, even in the event of such enhanced diffusion from drain region 8 reaching across body node 12 fully to p+ region 20, a reverse-biased p−n junction results, instead of a n-type to n-type short circuit as would result in transistor 1 of FIG. 2.

Figure 4A:
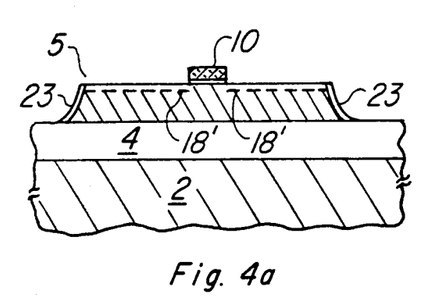
FIGS. 4a through 4e are cross-sectional views of the transistor of FIG. 3 illustrating various steps in its formation according to a first method of formation.

Referring now to FIGS. 4a through 4e, a method for fabricating transistor 100 of FIG. 3 will be described. The method will be described for an n-channel transistor 100, but a p-channel transistor could of course be similarly fabricated with opposite dopant type. FIG. 4a illustrates a mesa 5 upon which doped n-type polysilicon gate electrode 10 is disposed thereover, with gate dielectric 14 underlying gate electrode 10. The entirety of mesa 5 in which is to be formed n-channel transistors 100 is then exposed to a relatively light ion implantation of n-type impurity, for eventual formation of LDD regions 18 which are self-aligned relative to gate electrode 10 as shown in FIG. 3. An example of such an LDD implant is a phosphorous implant at 80 keV, with a dose of $4E13/cm^2$. Referring to FIG. 4a, the dashed lines 18' indicate the location of the dopant LDD implant near the surface of mesa 5. It should be noted that, while FIG. 4a shows that no oxide layer overlies the surface of mesa 5 not underlying gate electrode 10, it may be preferable to perform the ion implantation steps into mesa 5 through a thin layer of gate oxide, as is well known in the art to prevent tunneling of the implanted ions to an undesired depth and distribution.

Figure 4B:
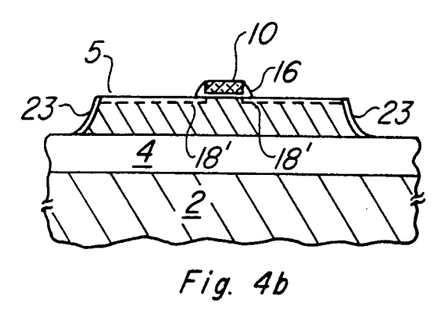

It should be noted that this method of fabrication could be used for the formation of an n-channel transistor 100 in conjunction with a p-channel transistor, according to the well known CMOS technology. Such a p-channel transistor (not shown in FIGS. 4a through 4e) could either be formed in a portion of mesa 5 which is electrically isolated from that shown in the Figures, and doped to n-type, or in a separate mesa doped n-type. In the CMOS flow, the n-type mesa into which the p-channel transistor is to be formed would be masked from the n-type LDD implant described above, and mesa 5 of FIG. 4a would be masked from a p-type LDD implant provided to the p-channel transistor, if LDD construction for the p-channel transistor is desired. Subsequent to the LDD implant, formation of the sidewall oxide filaments 16 is accomplished as described in the above-referenced U.S. Pat. No. 4,356,623. In such a method, a layer of silicon dioxide is deposited over the surface of the structure to a thickness on the order of the thickness of gate electrode 10 (e.g., 300 nm), and is then anisotropically etched to leave sidewall filaments 16 on the sides of gate electrode 10, as shown in FIG. 4b. In the CMOS method, sidewall filaments 16 would preferably be formed on the sides of the gates of the p-channel transistors, as well.

Figure 4C:
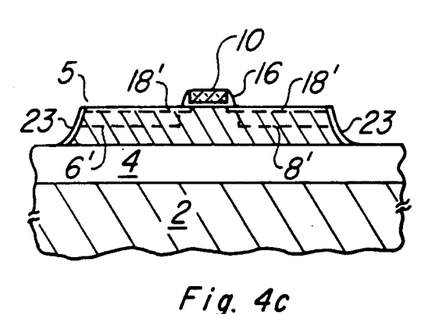

After formation of the sidewall oxide filaments 16, mesa 5 into which n-channel transistor 100 is to be formed is subjected to the heavy n-type source/drain implant. This implant is self-aligned to the sidewall oxide filaments 16, so that the more heavily doped source and drain regions 6 and 8 will be spaced from the edge of gate electrode 10, with LDD extensions 18 as shown in FIG. 3 extending under the sidewall oxide filament 16. The source/drain implant may be of either a single dopant (e.g., arsenic or phosphorous) or, as in the example of this embodiment, both an arsenic and a phosphorous implant. An example of such an implant is an arsenic implant of $3E15/cm^2$ dose at 120 keV and a phosphorous implant of $5E14/cm^2$ dose at 140 keV. FIG. 4c illustrates, by dashed lines 6' and 8' for the source and drain, respectively, the location of dopant from this implant. If a CMOS structure is being formed, the p-channel transistor area would be masked from receiving this implant.

At this point in the process of forming n-channel transistor 100, a p-type implant for formation of p+ contact region 20 can be performed, on the source side of the transistor only. Such an implant is designed to form the oppositely doped region from the source, underlying the source as illustrated in FIG. 3. It has been found, however, that in the formation of a boron-doped p+ region 20 in an n-channel LDD transistor the implant profile of boron can result in counterdoping of the source-side LDD region 18. This counterdoping is due primarily to the large lateral straggle of implanted boron from the defining mask edge, which in this case is the edge of sidewall oxide filament 16 on the source side of gate electrode 10. Of course, if LDD region 18 is counterdoped p-type, the transistor 100 will be inoperable. It is therefore preferable to ensure that the n-type dopant for LDD region 18 on the source side is not so counterdoped.

Figure 4D:
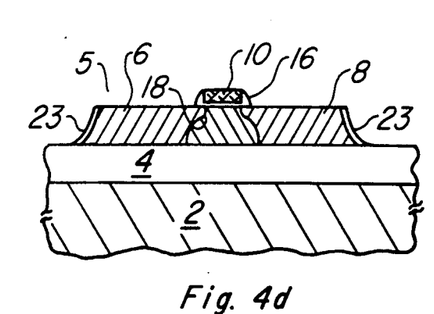

According to a first preferred method, such counterdoping is prevented by performing the drive-in anneal for the n-type source/drain implants prior to the implant of the p-type dopant for p+ region 20. This anneal is a conventional anneal, for example an anneal in an inert ambient at a temperature in the range from 850 to 900 degrees Celsius, for a time in the range from 40 to 60 minutes. The result of this anneal is the diffusion of the implanted n-type dopant to form source region 6 and drain region 8, each having LDD regions 18 extending under the sidewall oxide filaments 16, as shown in FIG. 4d. In this example, source and drain region 6 and 8 fully extend through mesa 5 to insulating film 4; it should be noted, however, that such full extension of source and drain regions 6 and 8 is a matter of choice, as the invention is equivalently applicable to thick film SOI and bulk applications, as will be described hereinbelow.

Figure 4E:
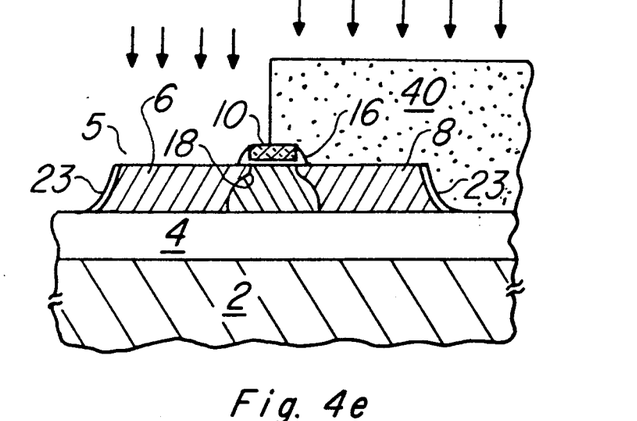

A masking layer 40 is then provided to protect drain region 8 from the p-type implant used to form p+ region 20. Masking layer 40 is preferably a layer of photoresist, patterned according to conventional photolithographic techniques. It is preferable for purposes of alignment tolerance that masking layer 40 overlap onto gate electrode 10, as shown in FIG. 4e. However, if counterdoping of gate electrode 10 by this implant is of concern, masking layer 40 can be extended to fully cover gate electrode 10 but not source region 6. Boron is then implanted for p+ region 20, for example at a dose of $3E15/cm^2$ at an energy in the range of 50 to 60 keV.

It should be noted that, if transistor 100 is being formed in a CMOS structure, the boron implant for forming p+ region 20 may simultaneously be used to form the source and drain regions of the p-type transistor (not shown). In this case, the masking layer 40 would not be present over the portion of the mesa into which the p-channel transistor is to be formed. Alternatively, of course, the implant for p+ region 20 could be optimized independently from the p-type source/drain implant, in which case the p-channel transistor area would be masked during the implant of FIG. 4e, and in which case transistor 100 would be masked during the p-type source/drain implant.

After the p-type implant, a drive-in anneal for diffusion of the boron dopant and formation of p+ region 20 is then performed. This anneal can be at time and temperature similar to the n-type source/drain anneal described above. The resulting structure is as shown in FIG. 3, with p+ region 20 underlying source region 6. If desired, the surfaces of source region 6, drain region 8 and gate electrode 10 can be clad with a refractory metal silicide for reduction of the sheet resistance. Examples of such refractory metals include titanium, cobalt, molybdenum and tungsten. A preferred method for such silicidation is the direct reaction of a layer of refractory metal with exposed underlying silicon, for example as described in the above-referenced U.S. Pat. No. 4,356,623. Subsequent processing to form the desired metal interconnections to transistor 100, whether or not silicidation is used, can then be performed in the conventional manner.

Figure 5A:
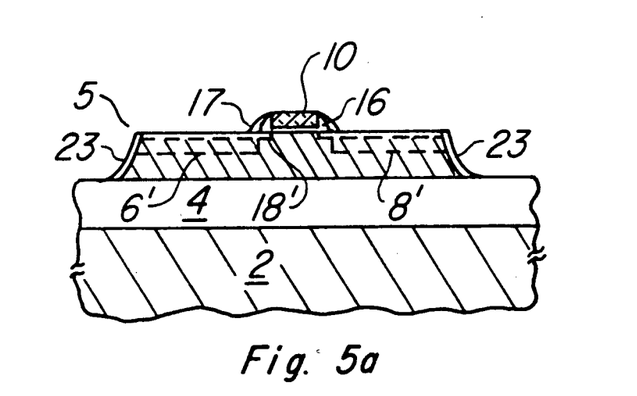
FIGS. 5a through 5c are cross-sectional views of the transistor of FIG. 3 illustrating various steps in its formation according to a second alternative method of formation.
Figure 5B:
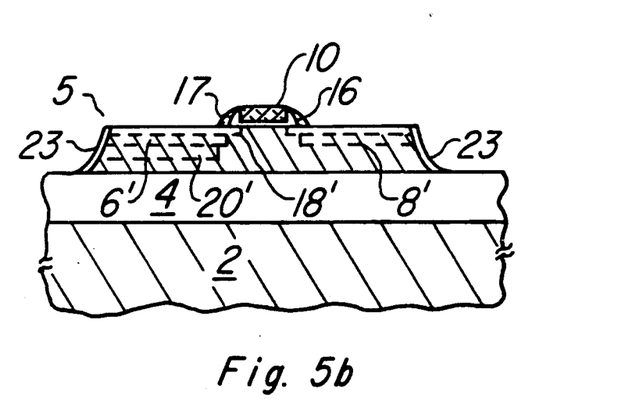
Figure 5C:
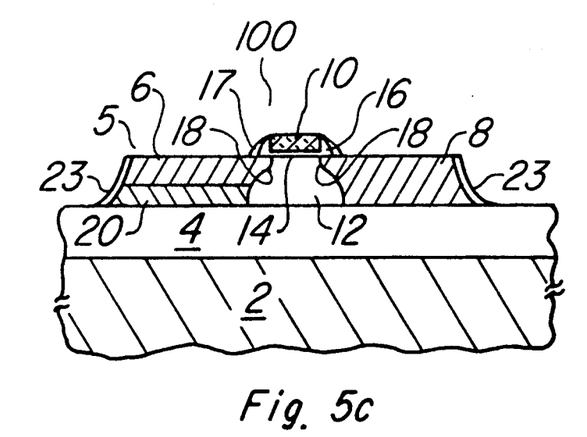

A second alternative method for forming p+ region 20 while preventing the counterdoping of LDD region 18 with the boron from the p-type implant will now be described with reference to FIGS. 5a through 5c. This alternative method begins with the structure of FIG. 4c, after implant of the arsenic and phosphorous source/drain regions. Prior to the p-type implant to form p+ region 20, second sidewall oxide filaments 17 are formed adjacent sidewall oxide filaments 16, by the deposition of a second layer of silicon dioxide followed by anisotropic etching thereof, in similar manner as in the formation of the first sidewall oxide filaments 16 described hereinabove. The thickness of the layer used to form second sidewall filaments 17 is determined by the lateral straggle of the boron implant at the particular energy used, as second sidewall oxide filaments 17 will space the boron implant a further distance apart from the active region under the gate electrode 10 so that the lateral straggle of the implant will be less able to counterdope LDD region 18. For example, the thickness of the oxide layer forming second sidewall oxide filaments 17 may be on the order of 100 nm; second sidewall oxide filaments 17 are thus thinner than sidewall oxide filaments 16 formed from a 300 nm thick layer. It should be noted that the boron implant should not be pulled away from the edge of sidewall oxide filaments 16 far enough so that the resulting p+ region is separated from body node 12 by a portion of source region 6, as this would defeat the desired connection. Masking layer 40 is provided to protect the drain side of the transistor in similar fashion as shown in FIG. 4d, and the boron implant of dose 3E15/cm$^2$ at an energy on the order of 50 to 60 keV is then performed. Masking layer 40 is then removed, with the resulting structure as shown in FIG. 5b. The drive-in anneal is then performed as in the prior method, resulting in the structure of FIG. 5c, where p+ region 20 underlies source region 6, providing a tunnel diode connection therebetween so that the body region 12 is biased substantially to the potential of the source region.

Figure 6:
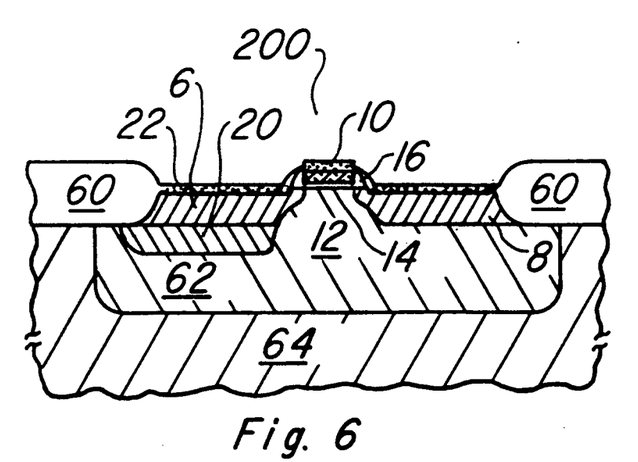
FIG. 6 is a cross-sectional view of a transistor constructed in bulk silicon constructed according to the invention.

Referring now to FIG. 6, a cross-section of transistor 200 constructed according to the invention is shown formed in bulk, rather than in an SOI film; similar reference numerals refer to similar elements as transistor 100 of FIG. 3. Field oxide structures 60, formed according to the well known LOCOS local oxidation technique, define the active portions of substrate 64 at which transistors can be formed. In this particular example, substrate 64 is n-type, and has a p-type doped well 62 formed at the surface thereof. Transistor 200 has source region 6 and drain region 8, each n+ type diffused regions, and each having LDD regions 18 extending under the sidewall oxide filaments 16 as in the prior case. P+ region 20 is formed to underlie source region 6, in similar manner as in transistor 100 of FIG. 3, so that a tunnel diode is in place between source region 6 and body node 12 underlying gate electrode 10. Accordingly, body node 12 is biased substantially to the potential of the source region 6. In transistor 200 of FIG. 6, refractory metal silicide film 22 is shown in place overlying each of source region 6, drain region 8, and gate electrode 10; silicide film 22 is preferably formed by way of the direct react silicide process described hereinabove.

In transistor 200 of FIG. 6 formed in bulk, it should be noted that p+ region 20 can be implanted relatively deeply relative to source region 6, as no insulating film 4 is present to which source region 6 would otherwise extend. Although a deep implant of boron would result in a wider lateral straggle of the boron dopant, it should be noted that the bulk case (as would the thick SOI case) would allow a mask to pull back the boron implant even further away from the sidewall oxide filament 16 than in the method described hereinabove relative to FIGS. 5a through 5c. The connection between p+ region 20 and body node 12 would not be defeated if the boron implant were pulled away from the gate edge by a mask, since ohmic connection between p+ region 20 and body node 12 would still be made by the bottom of p+ region 20 being in contact with well 62. Accordingly, a bulk transistor 200 is provided which has a body node biased to source potential, without a topside contact and the associated area required for conventional transistors.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such additional embodiments would of course include, without limitation thereto, thick film SOI transistors, silicon-on-sapphire transistors, p-channel transistors, and abrupt junction transistors, constructed according to the invention. It is contemplated that such changes and additional embodiments are within the spirit and true scope of the invention as claimed below.

I claim:

1. A field-effect transistor formed at a surface of a semiconductor, comprising:
   a source region of a first conductivity type formed at said surface;
   a drain region of said first conductivity type formed at said surface;
   a gate disposed over said surface at a location between said source and drain regions;
   a body node region of a second conductivity type disposed in said semiconductor underlying said gate;
   a highly doped contact region of said second conductivity type disposed only under said source region and in contact with said body node region, said contact region being more highly doped than said body node region, said body node region being not externally shortened to said source region, said transistor not having a region of said second conductivity type under said drain region; and
   wherein said contact region and said source region are both sufficiently highly doped so that conduction from the contact region to the source region occurs under operating drain-to-source bias conditions, whereby the body node is biased to a potential close to that of the source region.

2. The transistor of claim 1, further comprising:
   a layer of an insulating film;
   wherein said semiconductor is disposed over said layer of insulating film.

3. The transistor of claim 2, further comprising:
   a semiconductor substrate, wherein said layer of insulating film is disposed over a surface of said substrate.

4. The transistor of claim 1, further comprising:
   sidewall oxide filaments disposed along the sides of said gate.

5. The transistor of claim 4, wherein said source and drain regions each have a lightly-doped region extending under said sidewall oxide filaments.

6. The transistor of claim 4, further comprising:
   a refractory metal silicide film disposed at the surface of said source and drain regions and said gate.

7. The transistor of claim 1, further comprising:
   a layer of an insulating film;
   wherein said semiconductor is disposed over said layer of insulating film;
   and wherein said drain region and said contact region extend to said layer of insulating film.

8. A field-effect transistor, comprising:
   source and drain regions of a first conductivity type disposed at a surface of a semiconductor;

a gate disposed over said surface, at a location between said source and drain regions;

a body node region of a second conductivity type disposed under said gate and between said source and drain regions; and a tunnel diode connected between said source and said body node region with said tunnel diode being not externally shorted and with said field-effect transistor not having a tunnel diode between said drain and said body node region, whereby the body node is biased to a potential close to that of the source region.

9. The transistor of claim 8, wherein said tunnel diode comprises:

a contact region of said second conductivity type in contact with said source region and with said body node region, said contact region underlying said source region and having an impurity concentration substantially higher than said body node region.

10. The transistor of claim 8, wherein said tunnel diode comprises:

a contact region of said second conductivity type in contact with said source region and with said body node region, and which is heavily doped relative to said body node region.

11. The transistor of claim 8, wherein said tunnel diode comprises:

a contact region of said second conductivity type disposed under and in contact with said source region, and also in contact with said body node region.

12. The transistor of claim 8, further comprising:

a layer of an insulating film;

wherein said semiconductor is disposed over said layer of insulating film.

13. The transistor of claim 12, further comprising:

a semiconductor substrate, wherein said layer of insulating film is disposed over a surface of said substrate.

* * * * *